United States Patent
Hsu et al.

(10) Patent No.: US 12,477,835 B2
(45) Date of Patent: Nov. 18, 2025

(54) INTEGRATED CIRCUIT PROTECTION DEVICE AND METHOD

(71) Applicant: TAIWAN SEMICONDUCTOR MANUFACTURING COMPANY, LTD., Hsinchu (TW)

(72) Inventors: Chia-Lin Hsu, Hsinchu (TW); Yu-Ti Su, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 395 days.

(21) Appl. No.: 18/309,172

(22) Filed: Apr. 28, 2023

(65) Prior Publication Data

US 2024/0113099 A1   Apr. 4, 2024

Related U.S. Application Data

(60) Provisional application No. 63/387,477, filed on Dec. 14, 2022, provisional application No. 63/377,782, filed on Sep. 30, 2022.

(51) Int. Cl.
*H10D 62/00* (2025.01)
*H10D 62/13* (2025.01)
*H10D 84/80* (2025.01)
*H10D 84/85* (2025.01)
*H10D 89/60* (2025.01)

(52) U.S. Cl.
CPC ......... *H10D 89/611* (2025.01); *H10D 62/152* (2025.01); *H10D 62/156* (2025.01); *H10D 84/811* (2025.01); *H10D 84/853* (2025.01); *H10D 84/856* (2025.01)

(58) Field of Classification Search
None
See application file for complete search history.

(56) References Cited

U.S. PATENT DOCUMENTS

| | | | |
|---|---|---|---|
| 2017/0069618 A1* | 3/2017 | Altolaguirre | ........ H10D 84/403 |
| 2019/0363076 A1* | 11/2019 | Hwang | ................ H10D 89/713 |
| 2020/0176441 A1* | 6/2020 | Gorbachov | ............... H03F 1/26 |
| 2022/0271029 A1* | 8/2022 | Liou | ..................... H10D 89/713 |

FOREIGN PATENT DOCUMENTS

| | | |
|---|---|---|
| TW | 578293 | 3/2004 |
| TW | 201027712 | 7/2010 |
| TW | 201739060 | 11/2017 |
| TW | 202111912 | 3/2021 |

* cited by examiner

*Primary Examiner* — Bilkis Jahan
(74) *Attorney, Agent, or Firm* — Hauptman Ham, LLP

(57) ABSTRACT

An IC device includes first and second CMOS structures positioned in n-type doped regions of a substrate, the first CMOS structure including a common gate terminal, first NMOS body and source contacts, and first PMOS body and source contacts, the second CMOS structure including a common drain terminal, second NMOS body and source contacts, and second PMOS body and source contacts. The IC device includes a first electrical connection from the common drain terminal to the common gate terminal, a clamp device including a diode, a second electrical connection from a cathode of the diode to the first PMOS body and source contacts, and a third electrical connection from an anode of the of the diode to the first NMOS body and source contacts, and entireties of each of the second and third electrical connections are positioned between the substrate and a third metal layer of the IC device.

20 Claims, 6 Drawing Sheets

600

| 610 | Construct first and second CMOS structures of an IC device in corresponding first and second n-type doped regions of a substrate |

| 620 | Construct first and/or second clamp devices in corresponding third and fourth n-type doped regions of the substrate, each of the clamp devices including a diode |

| 630 | Form a first plurality of metal segments overlying the substrate from a surface of the substrate through a second metal layer of the IC device, the first plurality of metal segments including electrical connections between the CMOS structures and corresponding diodes of the clamp devices |

| 640 | Form a second plurality of metal segments overlying the first plurality of metal segments, the second plurality of metal segments including electrical connections to metal interconnect structures configured to distribute power supply and reference voltage levels |

FIG. 6

INTEGRATED CIRCUIT PROTECTION DEVICE AND METHOD

PRIORITY CLAIM

The present application claims the priority of U.S. Provisional Application No. 63/377,782, filed Sep. 30, 2022, and the priority of U.S. Provisional Application No. 63/387,477, filed Dec. 14, 2022, each of which is incorporated herein by reference in its entirety.

BACKGROUND

The ongoing trend in miniaturizing integrated circuits (ICs) has resulted in progressively smaller devices which consume less power, yet provide more functionality at higher speeds than earlier technologies. Such miniaturization has been achieved through design and manufacturing innovations tied to increasingly strict specifications. Various electronic design automation (EDA) tools are used to generate, revise, and verify designs for semiconductor devices while ensuring that IC structure design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a flowchart of a method of manufacturing an IC device, in accordance with some embodiments.

DETAILED DESCRIPTION

Figure 1:
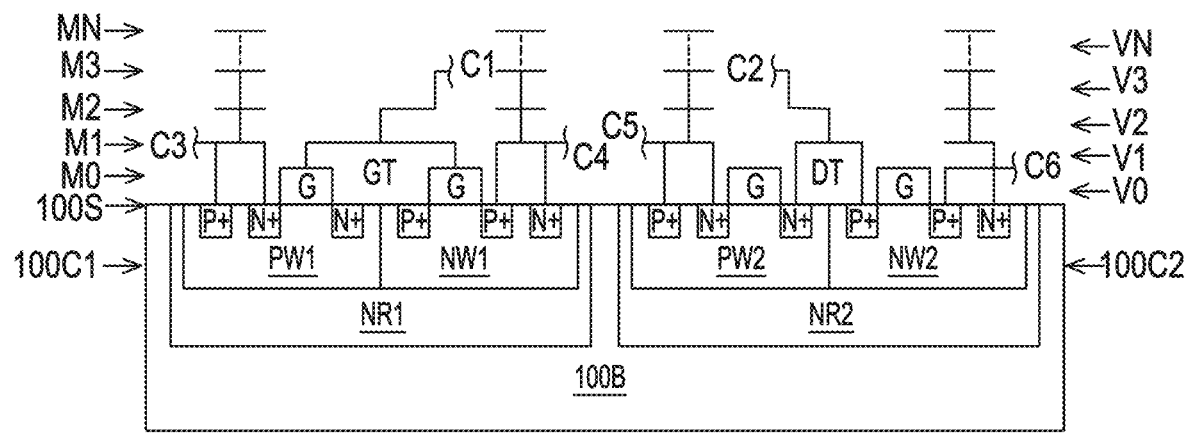
FIG. 1 is a diagram of an IC device, in accordance with some embodiments.
Figure 1:
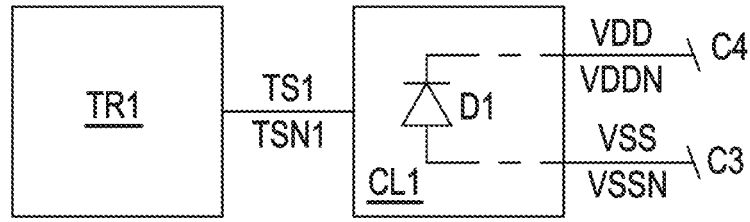
Figure 1:
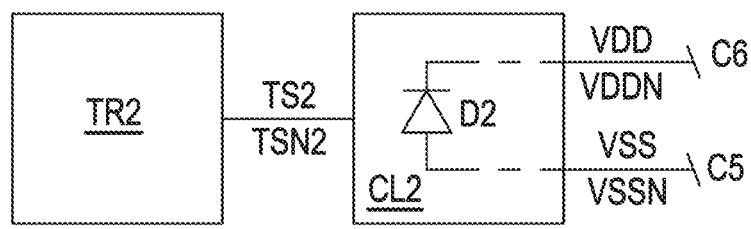

The following disclosure provides many different embodiments, or examples, for implementing different features of the provided subject matter. Specific examples of components, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, an integrated circuit (IC) device includes first and second complementary metal-oxide-semiconductor (CMOS) structures positioned in first and second n-type doped regions of a substrate, a first electrical connection between a common gate terminal of the first CMOS structure and a common drain terminal of the second CMOS structure, a clamp device including a diode positioned in a third n-typed doped region, a second electrical connection from a cathode of the diode to PMOS body and source contacts of the first CMOS structure, and a third electrical connection from an anode of the of the diode to NMOS body and source contacts of the second CMOS structure. By positioning entireties of each of the second and third electrical connections between the substrate and a third or lower metal layer of the IC device, a diode leakage path is established whereby potentially damaging charge accumulations are reduced during manufacturing operations used to form metal layers above those of the second and third electrical connections, thereby lowering the risk of process-induced-damage (PID) on the CMOS structures, particularly the gate dielectrics of the first CMOS device.

As discussed below, in accordance with various embodiments, FIG. 1 is a schematic diagram of an IC device, each of FIGS. 2-5 is a schematic diagram of a portion of an IC device, and FIG. 6 is a flowchart of a method of manufacturing an IC device.

Each of the figures herein, e.g., FIGS. 1-5, is simplified for the purpose of illustration. The figures are views of IC structures and devices with various features included and excluded to facilitate the discussion below. In various embodiments, an IC structure and/or device includes one or more features corresponding to power distribution structures, metal interconnects, contacts, vias, gate structures, source/drain (S/D) structures, bulk connections, or other transistor elements, isolation structures, or the like, in addition to the features depicted in FIGS. 1-5.

FIG. 1 is a schematic diagram of an IC device 100, in accordance with some embodiments. In addition to IC device 100, also referred to as circuit 100 in some embodiments, FIG. 1 depicts X and Z directions corresponding to a cross-sectional view of complementary metal-oxide-semiconductor (CMOS) structure elements of IC device 100 discussed below.

IC device 100 includes a substrate 100B in which n-type regions NR1 and NR2 are positioned. As discussed below, n-type region NR1 includes a p-well PW1 and an n-well NW1 and corresponds to a CMOS structure 100C1, and n-type region NR2 includes a p-well PW2 and an n-well NW2 and corresponds to a CMOS structure 100C2. IC device 100 also includes metal interconnect elements (not individually labeled for the purpose of clarity) arranged such that CMOS structure 100C1 is electrically connected to a clamp circuit CL1 coupled to a trigger circuit TR1, and/or CMOS structure 100C2 is electrically connected to a clamp circuit CL2 coupled to a trigger circuit TR2, as discussed below.

In the embodiment depicted in FIG. 1, n-type regions NR1 and NR2 are positioned in substrate 100B adjacent to each other. In some embodiments, one or more features, e.g., one or more additional n-type regions, are positioned in substrate 100B between n-type regions NR1 and NR2.

Substrate 100B includes a p-type semiconductor material, e.g., silicon, including one or more p-type dopants, e.g., boron, configured to support construction of various IC features, e.g., as discussed below. In some embodiments, substrate 100B is a portion of a silicon-on-oxide (SOI) configuration of a semiconductor wafer.

An n-type region, e.g., an n-type region NR1 or NR2, is a volume within substrate 100B including one or more n-type dopants, e.g., phosphorous or arsenic, having a doping concentration sufficiently large to form a p-n junction with the surrounding portions of substrate 100B. In some embodiments, an n-type region is referred to as an n+ buried layer or a deep n-well.

A p-well, e.g., p-well PW1 or PW2, is a volume within an n-type region including one or more p-type dopants having a doping concentration sufficiently large to form a p-n junction with the surrounding portions of the n-type region and sufficiently small to include a channel region having a conductivity controllable by an applied electric field.

An n-well, e.g., n-well NW1 or NW2, is a volume within an n-type region including one or more n-type dopants having a doping concentration sufficiently small to include a channel region having a conductivity controllable by an applied electric field.

Each of p-wells PW1 and PW2 and n-wells NW1 and NW2 includes one or more p-type regions P+ and one or more n-type regions N+ configured as discussed below. A region P+ or N+ is a volume within the corresponding p-well or n-well having a doping concentration significantly higher than that of the corresponding p-well or n-well. A region P+ positioned in a p-well or a region N+ positioned in an n-well is thereby configured as a body contact region, and a region N+ positioned in a p-well or a region P+ positioned in an n-well is thereby configured as a source or drain region.

Each of p-wells PW1 and PW2 includes a body contact region P+ and a source region N+ positioned on a first side of an overlying gate structure G, and a drain region N+ positioned on a second side of the overlying gate structure G, and is thereby configured as an n-type MOS (NMOS) transistor of the corresponding CMOS structure 100C1 or 100C2.

Each of n-wells NW1 and NW2 includes a body contact region N+ and a source region P+ positioned on a first side of an overlying gate structure G, and a drain region P+ positioned on a second side of the overlying gate structure G, and is thereby configured as an p-type MOS (PMOS) transistor of the corresponding CMOS structure 100C1 or 100C2.

In the embodiment depicted in FIG. 1, regions P+ and N+ are positioned in p-wells PW1 and PW2 and n-wells NW1 and NW2 as planar transistors corresponding to an upper surface 100S of substrate 100B. In some embodiments, regions P+ and N+ are otherwise positioned in p-wells PW1 and PW2 and n-wells NW1 and NW2, e.g., as fin field-effect transistors (FinFETs), corresponding to upper surface 100S.

A gate structure, e.g., an instance of gate structure G, is a volume positioned at or partially or entirely above upper surface 100S and including one or more conductive segments, e.g., a gate electrode, including one or more conductive materials, e.g., polysilicon, copper (Cu), aluminum (Al), tungsten (W), cobalt (Co), ruthenium (Ru), or one or more other metals or other suitable materials, substantially surrounded by one or more insulating materials, the one or more conductive segments thereby being configured to control a voltage provided to an adjacent gate dielectric layer.

A dielectric layer, e.g., a gate dielectric layer, is a volume including one or more insulating materials, e.g., silicon dioxide, silicon nitride ($Si_3N_4$), and/or one or more other suitable material such as a low-k material having a k value less than 3.8 or a high-k material having a k value greater than 3.8 or 7.0 such as aluminum oxide ($Al_2O_3$), hafnium oxide ($HfO_2$), tantalum pentoxide ($Ta_2O_5$), or titanium oxide ($TiO_2$), suitable for providing a high electrical resistance between IC structure elements, i.e., a resistance level above a predetermined threshold corresponding to one or more tolerance levels of a resistance-based effect on circuit performance.

The instances of regions P+ and N+ and the gate electrodes of gate structures G of CMOS structures 100C1 and 100C2 are electrically connected to each other and to other IC device elements through overlying metal interconnect elements of IC device 100 as depicted in FIG. 1.

The metal interconnect elements include metal segments positioned in metal layers M0 through MN along the Z direction, and via structures positioned in adjacent underlying via layers V0 through VN.

A metal segment is a volume including one or more conductive materials, e.g., polysilicon, copper (Cu), aluminum (Al), tungsten (W), cobalt (Co), ruthenium (Ru), or one or more other metals or other suitable materials, in a given metal layer of the manufacturing process used to construct IC device 100. In some embodiments, a metal segment positioned in metal layer M0 corresponds to a first metal layer, also referred to as a metal zero layer in some embodiments, a metal segment positioned in metal layer M1 corresponds to a second metal layer, also referred to as a metal one layer in some embodiments, and a metal segment positioned in metal layer M2 corresponds to a third metal layer, also referred to as a metal two layer in some embodiments. A given one of metal layers M0-MN is referred to as a metal layer Mn in some embodiments.

A total number N of metal layers M0-MN is a function of the manufacturing process. As the total number N increases, a number of plasma-based manufacturing processes used to form IC device 100 increases, and a risk of plasma-induced charge damage to a dielectric layer of an instance of gate structure G increases. In some embodiments, the total number N ranges from seven to ten. In some embodiments, the total number N has a value greater than ten, e.g., ranging from eleven to fifteen.

In some embodiments, a given metal layer, e.g., metal layer MN, corresponds to a power distribution layer of IC device 100, and metal segments positioned in the given metal layer correspond to interconnect structures, e.g., including one or more power rails, configured to distribute power supply and reference voltage levels. In some embodiments, an interconnect structure VDDN, also referred to as a power supply node VDDN, is configured to distribute a power supply voltage level VDD, and an interconnect structure VSSN, also referred to as a reference node VSSN, is configured to distribute a reference voltage level VSS.

A via structure, also referred to as a via in some embodiments, is a volume including one or more conductive materials configured to provide an electrical connection between an overlying conductive structure, e.g., a metal segment of a given metal layer Mn, and an underlying conductive structure such as a metal segment of an underlying metal layer Mn−1, a gate electrode of a gate structure G, or a region P+ or N+.

In some embodiments, a via structure is configured to provide the electrical connection to an underlying region P+ or N+ through a direct contact to the region P+ or N+. In some embodiments, IC device 100 includes one or more metal-like defined (MD) segments overlying and contacting a given region P+ or N+, and the overlying via structure is configured to provide the electrical connection to the underlying region P+ or N+ through a direct contact to a corresponding MD segment.

An MD segment is a conductive line or trace in and/or on substrate 100B including one or more conductive materials and/or a section of the semiconductor substrate and/or an epitaxial layer having a doping level, e.g., based on an implantation process, sufficient to cause the MD segment to have a resistance level below a specified level.

In some embodiments, a via structure overlying and electrically connected to a gate electrode of a gate structure G, a region P+ or N+, or an MD segment is referred to as a contact, a contact structure, or a terminal.

In the embodiment depicted in FIG. 1, the gate structures G of the NMOS and PMOS transistors of CMOS structure 100C1 are electrically connected to each other at metal layer M1 as a common gate terminal GT, and the drain regions N+ and P+ of the respective NMOS and PMOS transistors of CMOS structure 100C2 are electrically connected to each other at metal layer M1 as a common drain terminal DT. In some embodiments, common gate terminal GT and/or common drain terminal DT includes an electrical connection at a layer other than metal layer M1, e.g., metal layer M2.

IC device 100 includes one or more metal interconnect elements electrically connected to common gate terminal GT as an electrical connection C1, one or more metal interconnect elements electrically connected to common drain terminal DT as an electrical connection C2, and one or more metal interconnect elements (not shown for the purpose of clarity) electrically connected to each of electrical connections C1 and C2, such that IC device 100 is configured to include an electrical connection C1/C2 from common drain terminal DT to common gate terminal GT. In some embodiments, electrical connection C1/C2 corresponds to a signal path from common drain terminal DT to common gate terminal GT.

In the embodiment depicted in FIG. 1, electrical connection C1/C2 includes metal interconnect elements positioned in metal and via layers from upper surface 100S up to and including metal layer M3. In some embodiments, electrical connection C1/C2 includes metal interconnect elements positioned in metal and via layers from upper surface 100S up to and including a metal layer other than metal layer M3, e.g., a metal layer M4 or metal layer MN.

In the embodiment depicted in FIG. 1, the NMOS transistor of CMOS structure 100C1 includes body contact region P+ and source region N+ electrically connected to each other by a metal layer M1 segment, the PMOS transistor of CMOS structure 100C1 includes body contact region N+ and source region P+ electrically connected to each other by a metal layer M1 segment, the NMOS transistor of CMOS structure 100C2 includes body contact region P+ and source region N+ electrically connected to each other by a metal layer M1 segment, and the PMOS transistor of CMOS structure 100C2 includes body contact region N+ and source region P+ electrically connected to each other by a metal layer M0 segment. In some embodiments, one or both of CMOS structures 100C1 or 100C2 includes one or more electrical connections between corresponding body contact and source regions at one or more metal layers other than those depicted in FIG. 1, e.g., an entirety of electrical connections between corresponding body contact and source regions at metal layer M0.

IC device 100 includes one or more metal interconnect elements electrically connected to the common connection of the NMOS body contact and source regions of CMOS structure 100C1 as an electrical connection C3, one or more metal interconnect elements electrically connected to the common connection of the PMOS body contact and source regions of CMOS structure 100C1 as an electrical connection C4, one or more metal interconnect elements electrically connected to the common connection of the NMOS body contact and source regions of CMOS structure 100C2 as an electrical connection C5, and one or more metal interconnect elements electrically connected to the common connection of the PMOS body contact and source regions of CMOS structure 100C2 as an electrical connection C6.

Each of electrical connections C3 and C4 is electrically connected to an input terminal of clamp circuit CL1, and each of electrical connections C5 and C6 is electrically connected to an input terminal of clamp circuit CL2.

In the embodiment depicted in FIG. 1, an entirety of each of electrical connections C3-C6 includes metal interconnect elements positioned in metal and via layers from upper surface 100S up to and including metal layer M1. In some embodiments, an entirety of one or more of electrical connections C3-C6 includes metal interconnect elements positioned in metal and via layers from upper surface 100S up to and including a metal layer other than metal layer M1, e.g., metal layer M0 or M2.

Each of electrical connections C3 and C5 is further electrically connected to one or more overlying metal interconnect structures configured to distribute a reference voltage level, e.g., reference voltage node VSSN configured to distribute reference voltage level VSS, and each of electrical connections C4 and C6 is further electrically connected to one or more overlying metal interconnect structures configured to distribute a power supply voltage level, e.g., power supply voltage node VDDN configured to distribute power supply voltage level VDD.

Clamp circuit CL1 is an electronic circuit including one or more switching devices (not depicted in FIG. 1) configured to selectively provide a low resistance current path from power supply voltage node VDDN and electrical connection C4 to reference voltage node VSSN and electrical connection C3 responsive to a signal TS1 received from trigger circuit TR1 on a signal path TSN1.

Clamp circuit CL2 is an electronic circuit including one or more switching devices (not depicted in FIG. 1) configured to selectively provide a low resistance current path from power supply voltage node VDDN and electrical connection C6 to reference voltage node VSSN and electrical connection C5 responsive to a signal TS2 received from trigger circuit TR2 on a signal path TSN2.

Each of trigger circuits TR1 and TR2 is an electronic circuit configured to detect an overvoltage event, e.g., an electrical overstress (EOS) or electrostatic discharge (ESD) event on one or both of power supply voltage node VDDN or reference voltage node VSSN, and generate the corresponding signal TS1 or TS2 on signal path TSN1 or TSN2 responsive to detecting the overvoltage event.

Trigger circuit TR1 and clamp circuit CL1 are thereby configured to cause the switching device of clamp circuit CL1 to be switched on in response to detecting an overvoltage event and otherwise be switched off, and trigger circuit TR2 and clamp circuit CL2 are thereby configured to cause the switching device of clamp circuit CL2 to be switched on in response to detecting an overvoltage event and otherwise be switched off.

As depicted in FIG. 1, the switching device of clamp circuit CL1 includes a p-n junction labeled as a diode D1, and the switching device of clamp circuit CL2 includes a p-n junction labeled as a diode D2. An anode of diode D1 is coupled to electrical connection C3, a cathode of diode D1 is coupled to electrical connection C4, an anode of diode D2 is coupled to electrical connection C5, and a cathode of diode D2 is coupled to electrical connection C6.

In various embodiments, an anode or cathode is coupled to a corresponding electrical connection by a direct electrical connection or through an additional feature of the corresponding clamp circuit, e.g., another switching device and/or another p-n junction of the corresponding switching device.

The switching device of each of clamp circuits CL1 and CL2 is positioned in an n-type region (not shown in FIG. 1) of substrate 100B separate from n-type regions NR1 and NR2. In various embodiments, the n-type region is positioned adjacent to one of n-type regions NR1 or NR2, or one or more IC features is positioned between the n-type region and one or both of n-type regions NR1 or NR2.

In some embodiments, a switching device of a clamp circuit CL1 or CL2 includes an NMOS transistor N1 discussed below with respect to FIG. 2, a PMOS transistor P1 discussed below with respect to FIG. 3, a bipolar-junction transistor (BJT) PNP1 discussed below with respect to FIG. 4A, or a BJT NPN1 discussed below with respect to FIG. 4B.

In the embodiment depicted in FIG. 1, IC device 100 includes a single instance of clamp circuit CL1 electrically connected to electrical connections C3 and C4 and a single instance of clamp circuit CL2 electrically connected to electrical connections C5 and C6. In some embodiments, IC device 100 does not include one of clamp circuits CL1 or CL2, includes one or more additional instances of clamp circuit CL1 electrically connected to electrical connections C3 and C4, and/or includes one or more additional instances of clamp circuit CL2 electrically connected to electrical connections C5 and C6.

IC device 100 is thereby configured to include at least one instance of a clamp circuit switching device including diode D1 or D2 having an anode electrically connected to electrical connection C3 or C5 and a cathode electrically connected to electrical connection C4 or C6. The corresponding CMOS structure 100C1 or 100C2 thereby includes a leakage path from the PMOS body contact region N+ through the corresponding electrical connection C4 or C6, the corresponding diode D1 or D2, and the corresponding electrical connection C3 or C5 to the NMOS body contact region P+.

Because the entireties of electrical connections C3-C6 are positioned between upper surface 100S of substrate 100B and metal layer M3 (or metal layer M2 in some embodiments), the leakage path is constructed prior to the execution of plasma-based manufacturing processes used to form overlying metal layers, e.g., metal layers M3-MN or metal layers M2-MN. In some embodiments, the execution of the plasma-based manufacturing processes used to form the overlying metal layers corresponds to the formation of metal segments, e.g., in metal layer M3, included in electrical connection C1/C2.

In some embodiments, a total length of the leakage path is thereby less than a length of electrical connection C1/C2.

By including at least one diode leakage path constructed prior to the formation of metal segments at or above metal layer M1, M2, or M3, e.g., those included in electrical connection C1/C2, IC device 100 is capable of providing a discharge path between the corresponding PMOS and NMOS body contact regions whereby potentially damaging charge accumulations are reduced during manufacturing operations used to form overlying metal layers, thereby lowering the risk of PID on the CMOS structures, particularly the dielectrics of the instances of gate structures G in CMOS device 100C1.

Figure 2:
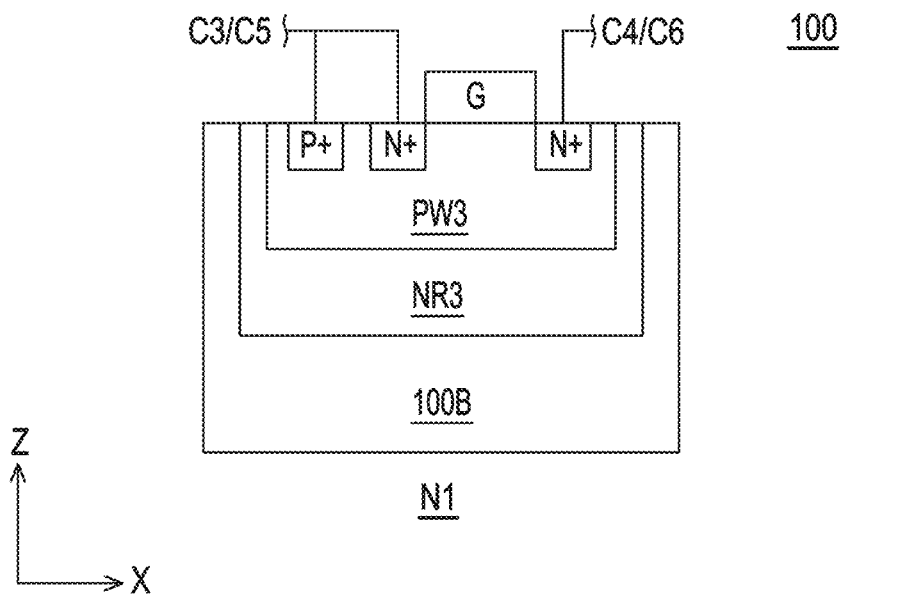
FIG. 2 is a diagram of a portion of an IC device, in accordance with some embodiments.
Figure 2:
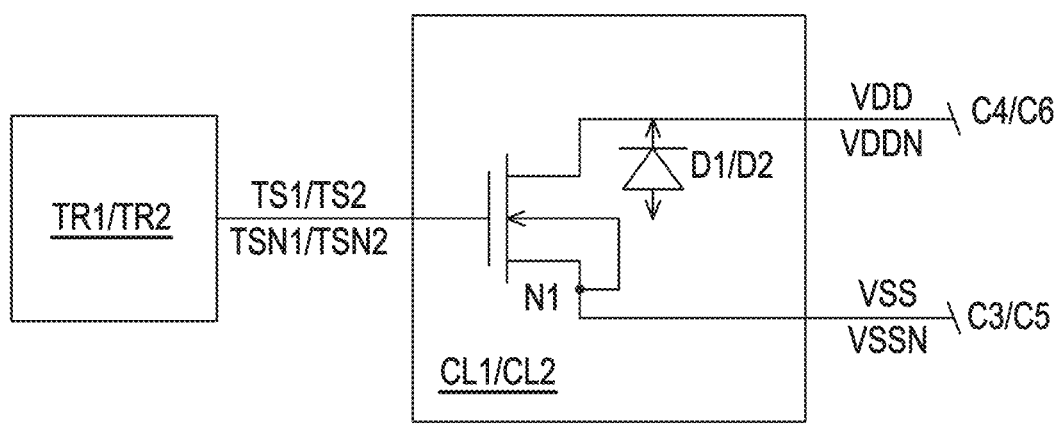

Each of FIGS. 2-4B is a diagram of a portion of IC device 100, in accordance with some embodiments. Each of FIGS. 2-4B depicts collective representations of trigger circuits TR1 and TR2, signal paths TSN1 and TSN2, clamp circuits CL1 and CL2 including diodes D1 and D2, electrical connections C3 and C5, and electrical connections C4 and C6, each discussed above with respect to FIG. 1. FIG. 2 further depicts a cross-sectional view of NMOS transistor N1 and the X and Z directions, and FIG. 3 further depicts a cross-sectional view of PMOS transistor P1 and the X and Z directions.

Figure 3:
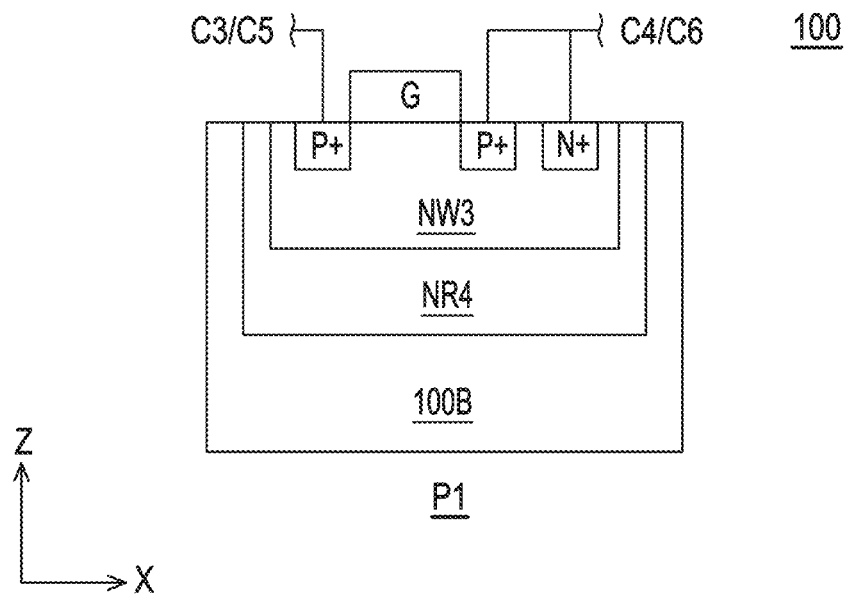
FIG. 3 is a diagram of a portion of an IC device, in accordance with some embodiments.
Figure 3:
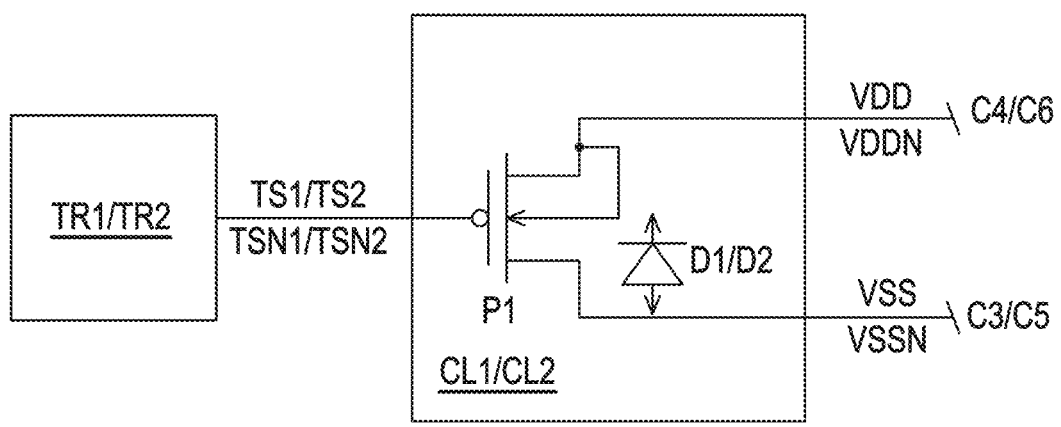
Figure 4A:
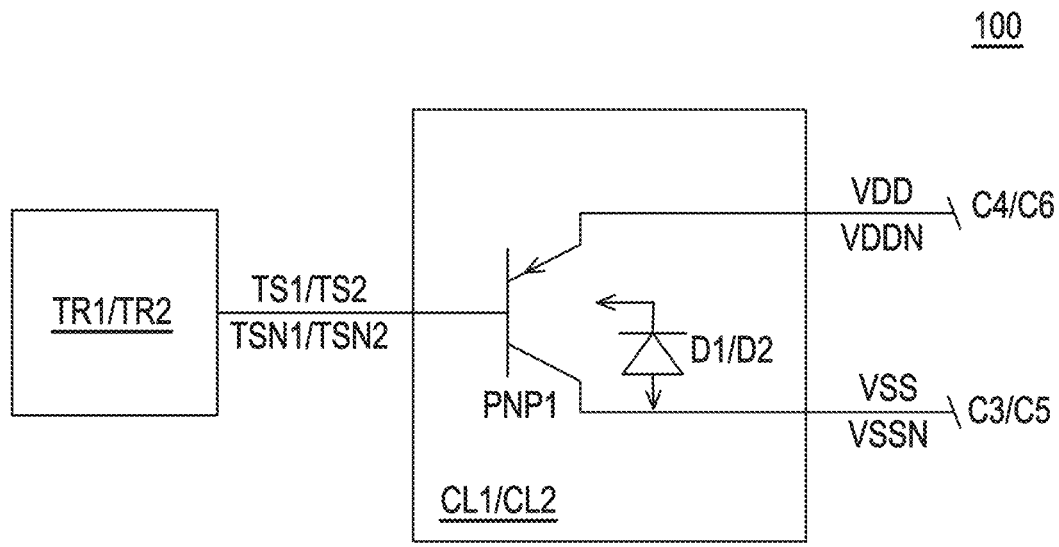
FIGS. 4A and 4B are schematic diagrams of portions of an IC device, in accordance with some embodiments.
Figure 4B:
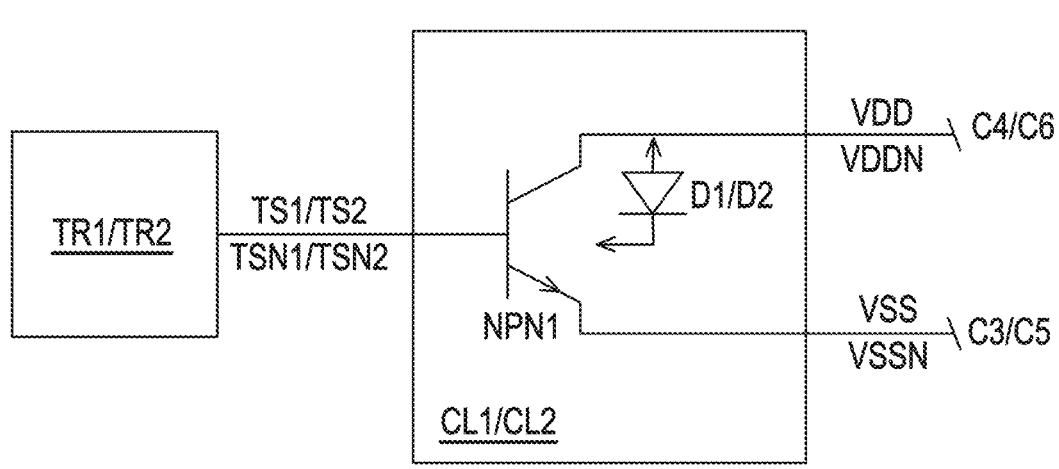

As discussed below, each of NMOS transistor N1 depicted in FIG. 2, PMOS transistor P1 depicted in FIG. 3, BJT PNP1 depicted in FIG. 4A, and BJT NPN1 depicted in FIG. 4B is usable as a switching device of one or both of clamp circuits CL1 or CL2.

As depicted in FIG. 2, NMOS transistor N1 includes an n-type region NR3 positioned in substrate 100B and a p-well PW3 positioned in n-type region NR3. A body contact region P+ and a source region N+ are positioned in p-well PW3 on a first side of a gate structure G and electrically connected to each other and to a corresponding one of electrical connection C3 or C5. A drain region N+ is positioned in p-well PW3 on a second side of gate structure G and electrically connected to a corresponding one of electrical connection C4 or C6. A gate electrode of gate structure G is electrically connected to signal path TSN1 or TSN2 and thereby configured to receive corresponding signal TS1 or TS2.

Body contact region P+ of NMOS transistor N1 thereby corresponds to the anode of the corresponding diode D1 or D2, and drain region N+ of NMOS transistor N1 thereby corresponds to the cathode of the corresponding diode D1 or D2.

As depicted in FIG. 3, PMOS transistor P1 includes an n-type region NR4 positioned in substrate 100B and an n-well NW3 positioned in n-type region NR4. A body contact region N+ and a source region P+ are positioned in n-well NW3 on a first side of an instance of gate structure G and electrically connected to each other and to a corresponding one of electrical connection C4 or C6. A drain region P+ is positioned in n-well NW3 on a second side of the instance of gate structure G and electrically connected to a corresponding one of electrical connection C3 or C5. A gate electrode of the instance of gate structure G is electrically connected to signal path TSN1 or TSN2 and thereby configured to receive corresponding signal TS1 or TS2.

Drain region P+ of PMOS transistor P1 thereby corresponds to the anode of the corresponding diode D1 or D2, and body contact region N+ of PMOS transistor P1 thereby corresponds to the cathode of the corresponding diode D1 or D2.

As depicted in FIG. 4A, BJT PNP1 includes an emitter electrically connected to a corresponding one of electrical connection C4 or C6, a collector electrically connected to a corresponding one of electrical connection C3 or C5, and a base electrically connected to signal path TSN1 or TSN2 and thereby configured to receive corresponding signal TS1 or TS2. The emitter of BJT PNP1 thereby corresponds to the anode of the corresponding diode D1 or D2, and the base of BJT PNP1 thereby corresponds to the cathode of the corresponding diode D1 or D2.

As depicted in FIG. 4B, BJT NPN1 includes a collector electrically connected to a corresponding one of electrical connection C4 or C6, an emitter electrically connected to a corresponding one of electrical connection C3 or C5, and a base electrically connected to signal path TSN1 or TSN2 and thereby configured to receive corresponding signal TS1 or TS2. The base of BJT NPN1 thereby corresponds to the anode of the corresponding diode D1 or D2, and the collector of BJT NPN1 thereby corresponds to the cathode of the corresponding diode D1 or D2.

Each of NMOS transistor N1 depicted in FIG. 2, PMOS transistor P1 depicted in FIG. 3, BJT PNP1 depicted in FIG. 4A, and BJT NPN1 depicted in FIG. 4B is thereby configured to be usable as a switching device of clamp circuit CL1 or CL2, and IC device 100 including one or more of NMOS transistor N1, PMOS transistor P1, BJT PNP1, or BJT NPN1 is thereby capable of realizing the benefits discussed above.

Figure 5:
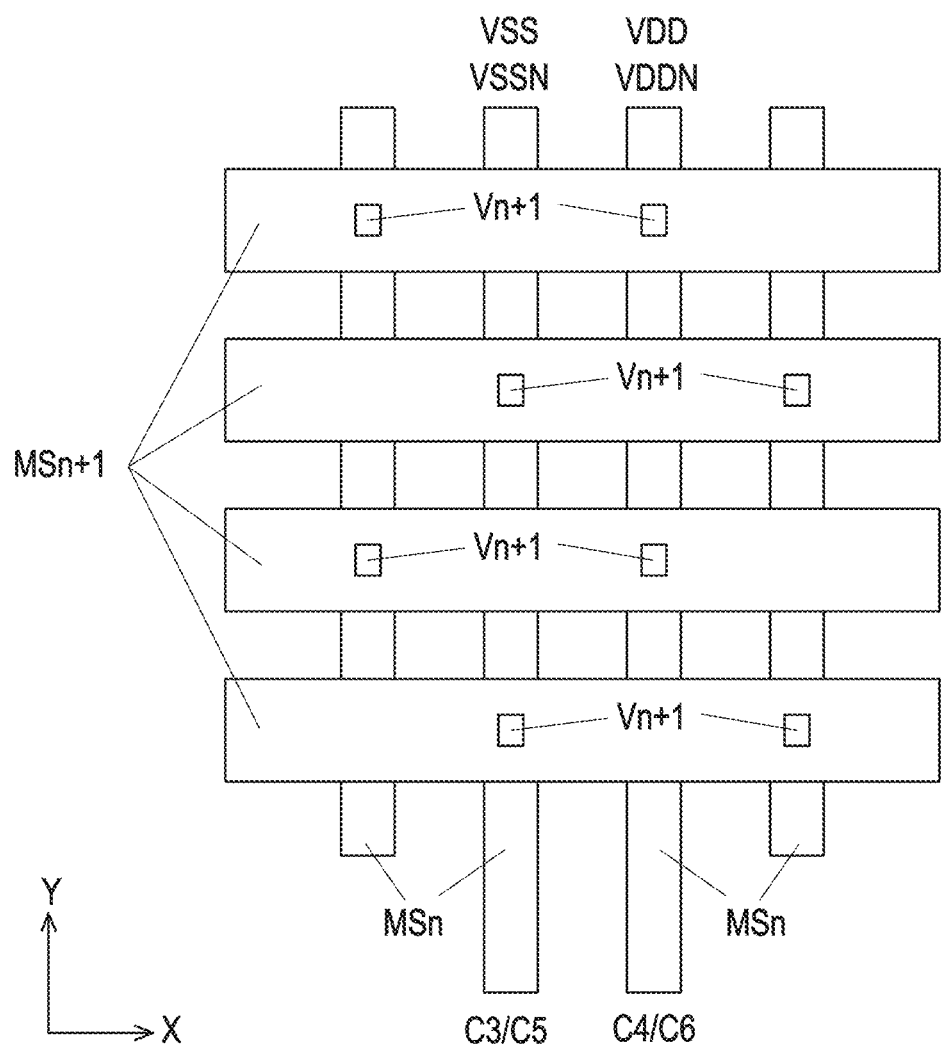
FIG. 5 is a diagram of a portion of an IC device, in accordance with some embodiments.

FIG. 5 is a diagram of a portion of IC device 100, in accordance with some embodiments. FIG. 5 depicts the X direction, a Y direction, and a corresponding plan view of metal interconnect structures corresponding to power supply node VDDN and reference node VSSN, each discussed above with respect to FIG. 1.

Each of power supply node VDDN and reference node VSSN includes instances of metal segments MSn extending in the Y direction in a metal layer Mn (not labeled), instances of metal segments MSn+1 extending in the X direction in an overlying metal layer Mn+1 (not labeled), and instances of vias Vn+1 configured to electrically connect metal segments MSn to corresponding metal segments MSn+1.

Metal segments MSn correspond to metal layer Mn being one of metal layers M0-M2, a first instance of metal segment MSn corresponds to one of electrical connections C3 or C5, and a second instance of metal segment MSn corresponds to one of electrical connections C4 or C6.

Metal segments MSn+1, vias Vn+1, and additional overlying metal segments and vias in some embodiments, are configured to electrically connect the one of electrical connections C3 or C5 to reference node VSSN configured to distribute reference voltage level VSS, and to electrically connect the one of electrical connections C4 or C6 to power supply node VDDN configured to distribute power supply voltage level VDD.

Metal segments MSn and MSn+1 and vias Vn+1 are thereby configured to include some or all of electrical connections C3-C6 and to further electrically connect electrical connections C3 and C5 to reference node VSSN and electrical connections C4 and C6 to power supply node VDDN such that IC device 100 including metal segments MSn and MSn+1 and vias Vn+1 is thereby capable of realizing the benefits discussed above.

FIG. 6 is a flowchart of a method 600 of manufacturing an IC device, in accordance with some embodiments. Method 600 is operable to form IC device 100 discussed above with respect to FIGS. 1-5.

In some embodiments, the operations of method 600 are performed in the order depicted in FIG. 6. In some embodiments, the operations of method 600 are performed in an order other than the order depicted in FIG. 6. In some embodiments, one or more additional operations are performed before, during, and/or after the operations of method 600.

At operation 610, in some embodiments, first and second CMOS structures of an IC device are constructed in corresponding first and second n-type doped regions of a substrate. In some embodiments, constructing the first and second CMOS structures includes forming CMOS structures 100C1 and 100C2, e.g., including instances of gate structures G, discussed above with respect to FIGS. 1-5.

In various embodiments, forming the first and second CMOS structures includes performing a plurality of manufacturing operations, e.g., one or more of a lithography, diffusion, deposition, etching, planarizing, or other operations suitable for forming n-type and p-type regions and gate structures as discussed above with respect to FIGS. 1-5.

At operation 620, first and/or second clamp devices are constructed in corresponding third and fourth n-type doped regions of the substrate, each of the clamp devices including a diode. Constructing the clamp device includes forming the diode including an anode and a cathode.

In some embodiments, constructing the first and/or second clamp devices includes constructing clamp devices CL1 and/or CL2 including forming corresponding diodes D1 and/or D2 discussed above with respect to FIGS. 1-5. In some embodiments, constructing the first and/or second clamp devices includes constructing corresponding trigger circuits TR1 and/or TR2 discussed above with respect to FIGS. 1-5.

In some embodiments, constructing the first and/or second clamp devices includes constructing one or more instances of NMOS transistor N1 discussed above with respect to FIG. 2, one or more instances of PMOS transistor P1 discussed above with respect to FIG. 3, one or more instances of BJT PNP1 discussed above with respect to FIG. 4A, and/or one or more instances of BJT NPN1 discussed above with respect to FIG. 4B.

In various embodiments, forming the first and/or second clamp devices includes performing a plurality of manufacturing operations, e.g., one or more of a lithography, diffusion, deposition, etching, planarizing, or other operations suitable for forming n-type and p-type regions and gate structures as discussed above with respect to FIGS. 1-5

At operation 630, a first plurality of metal segments is formed overlying the substrate from a surface of the substrate through a second metal layer of the IC device, the first plurality of metal segments including electrical connections between the CMOS structures and corresponding diodes of the clamp devices.

Forming the first plurality of metal segments includes forming a first electrical connection from the cathode of the first diode to each of a first PMOS body contact region and first PMOS source region of the first CMOS structure and a second electrical connection from the anode of the first diode to each of a first NMOS body contact region and first NMOS source region of the first CMOS structure and/or forming a third electrical connection from the cathode of the second diode to each of a second PMOS body contact region and second PMOS source region of the second CMOS structure and a fourth electrical connection from the anode of the second diode to each of a second NMOS body contact region and second NMOS source region of the second CMOS structure.

In some embodiments, forming the first plurality of metal segments includes forming metal interconnect elements as discussed above with respect to FIGS. 1-5.

In various embodiments, forming the first plurality of metal segments includes performing a plurality of manufacturing operations, e.g., one or more of a lithography, diffusion, deposition, etching, planarizing, or other operations suitable for constructing metal segments and vias in accordance with the configurations discussed above with respect to FIGS. 1-5.

At operation 640, in some embodiments, a second plurality of metal segments is formed overlying the first plurality of metal segments, the second plurality of metal segments including electrical connections to metal interconnect structures configured to distribute power supply and reference voltage levels. In some embodiments, forming the second plurality of metal segments includes forming metal interconnect elements as discussed above with respect to FIGS. 1-5.

In some embodiments, forming the second plurality of metal segments includes forming an electrical connection from each of the first and third electrical connections to a first metal interconnect structure configured to distribute a power supply voltage level, e.g., power supply voltage VDD, and forming an electrical connection from each of the second and fourth electrical connections to a second metal interconnect structure configured to distribute a reference voltage level, e.g., reference voltage level VSS, as discussed above with respect to FIGS. 1-5.

In some embodiments, forming the second plurality of metal segments includes forming a portion of an electrical connection from a common drain terminal of the second CMOS structure to a common gate terminal of the first CMOS structure, e.g., electrical connection C1/C2 discussed above with respect to FIGS. 1-5.

In various embodiments, forming the second plurality of metal segments includes performing a plurality of manufacturing operations, e.g., one or more of a lithography, diffusion, deposition, etching, planarizing, or other operations suitable for constructing metal segments and vias in accordance with the configurations discussed above with respect to FIGS. 1-5.

By performing some or all of the operations of method 600, an IC device is formed including the features discussed above with respect to IC device 100 and is thereby capable of realizing the benefits discussed above with respect to IC device 100.

In some embodiments, an IC device includes a first CMOS structure positioned in a first n-type doped region of a substrate, the first CMOS structure including a common gate terminal, a first NMOS body contact, a first NMOS source contact, a first PMOS body contact, and a first PMOS source contact, a second CMOS structure positioned in a second n-type doped region of the substrate, the second CMOS structure including a common drain terminal, a second NMOS body contact, a second NMOS source contact, a second PMOS body contact, and a second PMOS source contact, a first electrical connection from the common drain terminal to the common gate terminal, a first clamp device including a first diode, a second electrical connection from a cathode of the first diode to each of the first PMOS body contact and the first PMOS source contact, and a third electrical connection from an anode of the of the first diode to each of the first NMOS body contact and the first NMOS source contact, wherein entireties of each of the second and third electrical connections are positioned between the substrate and a third metal layer of the IC device. In some embodiments, the IC device includes a second clamp device including a second diode, a fourth electrical connection from a cathode of the second diode to each of the second PMOS body contact and the second PMOS source contact, and a fifth electrical connection from an anode of the of the second diode to each of the second NMOS body contact and the second NMOS source contact, and entireties of each of the fourth and fifth electrical connections are positioned between the substrate and the third metal layer of the IC device. In some embodiments, the second electrical connection is further connected to an overlying metal interconnect structure configured to distribute a power supply voltage level. In some embodiments, the third electrical connection is further connected to an overlying metal interconnect structure configured to distribute a reference voltage level. In some embodiments, the first clamp circuit includes an NMOS transistor, the anode of the first diode includes a body contact of the NMOS transistor, and the cathode of the first diode includes a drain contact of the NMOS transistor. In some embodiments, the first clamp circuit includes a PMOS transistor, the anode of the first diode includes a drain contact of the PMOS transistor, and the cathode of the first diode includes a body contact of the PMOS transistor. In some embodiments, the first clamp circuit includes a bipolar transistor, and the first diode corresponds to a P-N junction of the bipolar transistor. In some embodiments, the IC device includes a trigger circuit coupled to the clamp circuit and configured to output a signal responsive to an ESD event, and the clamp circuit is configured to electrically couple the second and third electrical connections to each other responsive to the signal. In some embodiments, a length of the first electrical connection is greater than a sum of a length of the second electrical connection, a length of the third electrical connection, and a distance between the cathode and anode of the first diode. In some embodiments, the entireties of each of the second and third electrical connections are positioned between the substrate and a second metal layer of the IC device.

In some embodiments, an IC device includes a first CMOS structure positioned in a first n-type doped region of a substrate, the first CMOS structure including a common gate terminal, a first NMOS body contact, a first NMOS source contact, a first PMOS body contact, and a first PMOS source contact, a second CMOS structure positioned in a second n-type doped region of the substrate, the second CMOS structure including a common drain terminal, a second NMOS body contact, a second NMOS source contact, a second PMOS body contact, and a second PMOS source contact, a first electrical connection from the common drain terminal to the common gate terminal, and a first clamp device including a first diode, wherein a length of the first electrical connection is greater than a length of a first current path, the first current path including a second electrical connection from each of the first PMOS body and source contacts to a cathode of the first diode, the first diode, and a third electrical connection from an anode of the first diode to each of the first NMOS body and source contacts. In some embodiments, an entirety of the first current path is positioned in the substrate and between the substrate and a second metal layer of the IC device. In some embodiments, the IC device includes a second clamp device including a second diode, wherein the length of the first electrical connection is greater than a length of a second current path, the second current path including a fourth electrical connection from each of the second PMOS body and source contacts to a cathode of the second diode, the second diode, and a fifth electrical connection from an anode of the second diode to each of the second NMOS body and source contacts. In some embodiments, the first and second clamp circuits include respective first and second NMOS transistors positioned in corresponding n-type doped regions of the substrate, the anode of the first diode includes a body contact of the first NMOS transistor, the cathode of the first diode includes a drain contact of the first NMOS transistor, the anode of the second diode includes a body contact of the second NMOS transistor, and the cathode of the second diode includes a drain contact of the second NMOS transistor. In some embodiments, the first and second clamp circuits include respective first and second PMOS transistors positioned in corresponding n-type doped regions of the substrate, the anode of the first diode includes a drain contact of the first PMOS transistor, the cathode of the first diode includes a body contact of the first PMOS transistor, the anode of the second diode includes a drain contact of the second PMOS transistor, and the cathode of the second diode includes a body contact of the second PMOS transistor. In some embodiments, the second electrical connection is configured to electrically connect the first PMOS body and source contacts to a first metal interconnect structure configured to distribute a power supply voltage level, the third electrical connection is configured to electrically connect the first NMOS body and source contacts to a second metal interconnect structure configured to distribute a reference voltage level, and the first clamp circuit is configured to couple the first and second metal interconnect structures to each other responsive to a signal received from a trigger circuit.

In some embodiments, a method of manufacturing an IC device includes constructing a first CMOS structure in a first n-type doped region of a substrate, the constructing the first CMOS structure including forming a first NMOS body contact region, a first NMOS source region, a first PMOS body contact region, and a first PMOS source region, constructing a second CMOS structure in a second n-type doped region of the substrate, the constructing the second CMOS structure including forming a second NMOS body contact region, a second NMOS source region, a second PMOS body contact region, and a second PMOS source region, constructing a first clamp device in a third n-type region of the substrate, the constructing the first clamp device including forming a first diode comprising a first cathode and a first anode, constructing a second clamp device in a fourth n-type region of the substrate, the constructing the second clamp device including forming a second diode comprising a second cathode and a second anode, and forming a first plurality of metal segments overlying the substrate from a surface of the substrate through a second metal layer of the IC device, wherein the forming the first plurality of metal segments includes forming a first electrical connection from the first cathode to each of the first PMOS body contact region and the first PMOS source region, forming a second electrical connection from the first anode to each of the first NMOS body contact region and the first NMOS source region, forming a third electrical connection from the second cathode to each of the second PMOS body contact region and the second PMOS source region, and forming a fourth electrical connection from the second anode to each of the second NMOS body contact region and the second NMOS source region. In some embodiments, constructing each of the first and second clamp devices includes forming an NMOS transistor, and forming each of the first and second diodes includes forming the corresponding first or second cathode including a drain region of the NMOS transistor and forming the corresponding first or second anode including a body contact region of the NMOS transistor. In some embodiments, constructing each of the first and second clamp devices includes forming a PMOS transistor, and forming each of the first and second diodes includes forming the corresponding first or second cathode including a body contact region of the PMOS transistor and forming the corresponding first or second anode including a drain region of the PMOS transistor. In some embodiments, the method includes forming a second plurality of metal segments overlying the first plurality of metal segments, wherein the forming the second plurality of metal segments includes forming a fifth electrical connection from each of the first and third electrical connections to a first metal interconnect structure configured to distribute a power supply voltage level, forming a sixth electrical connection from each of the second and fourth electrical connections to a second metal interconnect structure configured to distribute a reference voltage level, and forming a portion of a seventh electrical connection from a common drain terminal of the second CMOS structure to a common gate terminal of the first CMOS structures.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit (IC) device comprising:
   a first complementary metal-oxide-semiconductor (CMOS) structure positioned in a first n-type doped region of a substrate, the first CMOS structure comprising a common gate terminal, a first n-type MOS (NMOS) body contact, a first NMOS source contact, a first p-type MOS (PMOS) body contact, and a first PMOS source contact;
   a second CMOS structure positioned in a second n-type doped region of the substrate, the second CMOS structure comprising a common drain terminal, a second NMOS body contact, a second NMOS source contact, a second PMOS body contact, and a second PMOS source contact;
   a first electrical connection from the common drain terminal to the common gate terminal;
   a first clamp device comprising a first diode;
   a second electrical connection from a cathode of the first diode to each of the first PMOS body contact and the first PMOS source contact; and
   a third electrical connection from an anode of the of the first diode to each of the first NMOS body contact and the first NMOS source contact,
   wherein entireties of each of the second and third electrical connections are positioned between the substrate and a third metal layer of the IC device.

2. The IC device of claim 1, further comprising:
   a second clamp device comprising a second diode;
   a fourth electrical connection from a cathode of the second diode to each of the second PMOS body contact and the second PMOS source contact; and
   a fifth electrical connection from an anode of the of the second diode to each of the second NMOS body contact and the second NMOS source contact,
   wherein entireties of each of the fourth and fifth electrical connections are positioned between the substrate and the third metal layer of the IC device.

3. The IC device of claim 1, wherein the second electrical connection is further connected to an overlying metal interconnect structure configured to distribute a power supply voltage level.

4. The IC device of claim 1, wherein the third electrical connection is further connected to an overlying metal interconnect structure configured to distribute a reference voltage level.

5. The IC device of claim 1, wherein
the first clamp device comprises an NMOS transistor,
the anode of the first diode comprises a body contact of the NMOS transistor, and
the cathode of the first diode comprises a drain contact of the NMOS transistor.

6. The IC device of claim 1, wherein
the first clamp device comprises a PMOS transistor,
the anode of the first diode comprises a drain contact of the PMOS transistor, and
the cathode of the first diode comprises a body contact of the PMOS transistor.

7. The IC device of claim 1, wherein
the first clamp device comprises a bipolar transistor, and
the first diode corresponds to a P-N junction of the bipolar transistor.

8. The IC device of claim 1, further comprising:
a trigger circuit coupled to the first clamp device and configured to output a signal responsive to an electrostatic discharge (ESD) event,
wherein the first clamp device is configured to electrically couple the second and third electrical connections to each other responsive to the signal.

9. The IC device of claim 1, wherein a length of the first electrical connection is greater than a sum of a length of the second electrical connection, a length of the third electrical connection, and a distance between the cathode and anode of the first diode.

10. The IC of claim 1, wherein
the entireties of each of the second and third electrical connections are positioned between the substrate and a second metal layer of the IC device.

11. An integrated circuit (IC) device comprising:
a first complementary metal-oxide-semiconductor (CMOS) structure positioned in a first n-type doped region of a substrate, the first CMOS structure comprising a common gate terminal, a first n-type MOS (NMOS) body contact, a first NMOS source contact, a first p-type MOS (PMOS) body contact, and a first PMOS source contact;
a second CMOS structure positioned in a second n-type doped region of the substrate, the second CMOS structure comprising a common drain terminal, a second NMOS body contact, a second NMOS source contact, a second PMOS body contact, and a second PMOS source contact;
a first electrical connection from the common drain terminal to the common gate terminal; and
a first clamp device comprising a first diode,
wherein a length of the first electrical connection is greater than a length of a first current path, the first current path comprising:
a second electrical connection from each of the first PMOS body and source contacts to a cathode of the first diode;
the first diode; and
a third electrical connection from an anode of the first diode to each of the first NMOS body and source contacts.

12. The IC device of claim 11, wherein
an entirety of the first current path is positioned in the substrate and between the substrate and a second metal layer of the IC device.

13. The IC device of claim 11, further comprising:
a second clamp device comprising a second diode,
wherein the length of the first electrical connection is greater than a length of a second current path, the second current path comprising:
a fourth electrical connection from each of the second PMOS body and source contacts to a cathode of the second diode;
the second diode; and
a fifth electrical connection from an anode of the second diode to each of the second NMOS body and source contacts.

14. The IC device of claim 13, wherein
the first and second clamp devices comprise respective first and second NMOS transistors positioned in corresponding n-type doped regions of the substrate,
the anode of the first diode comprises a body contact of the first NMOS transistor,
the cathode of the first diode comprises a drain contact of the first NMOS transistor,
the anode of the second diode comprises a body contact of the second NMOS transistor, and
the cathode of the second diode comprises a drain contact of the second NMOS transistor.

15. The IC device of claim 13, wherein
the first and second clamp devices comprise respective first and second PMOS transistors positioned in corresponding n-type doped regions of the substrate,
the anode of the first diode comprises a drain contact of the first PMOS transistor,
the cathode of the first diode comprises a body contact of the first PMOS transistor,
the anode of the second diode comprises a drain contact of the second PMOS transistor, and
the cathode of the second diode comprises a body contact of the second PMOS transistor.

16. The IC device of claim 11, wherein
the second electrical connection is configured to electrically connect the first PMOS body and source contacts to a first metal interconnect structure configured to distribute a power supply voltage level,
the third electrical connection is configured to electrically connect the first NMOS body and source contacts to a second metal interconnect structure configured to distribute a reference voltage level, and
the first clamp device is configured to couple the first and second metal interconnect structures to each other responsive to a signal received from a trigger circuit.

17. A method of manufacturing an integrated circuit (IC) device, the method comprising:
constructing a first complementary metal-oxide-semiconductor (CMOS) structure in a first n-type doped region of a substrate, the constructing the first CMOS structure comprising forming a first n-type MOS (NMOS) body contact region, a first NMOS source region, a first p-type MOS (PMOS) body contact region, and a first PMOS source region;
constructing a second CMOS structure in a second n-type doped region of the substrate, the constructing the second CMOS structure comprising forming a second NMOS body contact region, a second NMOS source region, a second PMOS body contact region, and a second PMOS source region;

constructing a first clamp device in a third n-type region of the substrate, the constructing the first clamp device comprising forming a first diode comprising a first cathode and a first anode;

constructing a second clamp device in a fourth n-type region of the substrate, the constructing the second clamp device comprising forming a second diode comprising a second cathode and a second anode; and forming a first plurality of metal segments overlying the substrate from a surface of the substrate through a second metal layer of the IC device, wherein the forming the first plurality of metal segments comprises:

forming a first electrical connection from the first cathode to each of the first PMOS body contact region and the first PMOS source region;

forming a second electrical connection from the first anode to each of the first NMOS body contact region and the first NMOS source region;

forming a third electrical connection from the second cathode to each of the second PMOS body contact region and the second PMOS source region; and forming a fourth electrical connection from the second anode to each of the second NMOS body contact region and the second NMOS source region.

18. The method of claim 17, wherein the constructing each of the first and second clamp devices comprises forming an NMOS transistor, and the forming each of the first and second diodes comprises forming the corresponding first or second cathode comprising a drain region of the NMOS transistor and forming the corresponding first or second anode comprising a body contact region of the NMOS transistor.

19. The method of claim 17, wherein the constructing each of the first and second clamp devices comprises forming a PMOS transistor, and the forming each of the first and second diodes comprises forming the corresponding first or second cathode comprising a body contact region of the PMOS transistor and forming the corresponding first or second anode comprising a drain region of the PMOS transistor.

20. The method of claim 17, further comprising:

forming a second plurality of metal segments overlying the first plurality of metal segments, wherein the forming the second plurality of metal segments comprises:

forming a fifth electrical connection from each of the first and third electrical connections to a first metal interconnect structure configured to distribute a power supply voltage level;

forming a sixth electrical connection from each of the second and fourth electrical connections to a second metal interconnect structure configured to distribute a reference voltage level; and forming a portion of a seventh electrical connection from a common drain terminal of the second CMOS structure to a common gate terminal of the first CMOS structure.

* * * * *